United States Patent
Veschetti et al.

(10) Patent No.: US 7,670,937 B2
(45) Date of Patent: Mar. 2, 2010

(54) METHOD FOR PRODUCING DOPED REGIONS IN A SUBSTRATE, AND PHOTOVOLTAIC CELL

(75) Inventors: Yannick Veschetti, Saint Clair de la Tour (FR); Armand Bettinelli, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 340 days.

(21) Appl. No.: 11/851,818

(22) Filed: Sep. 7, 2007

(65) Prior Publication Data

US 2008/0076240 A1 Mar. 27, 2008

(30) Foreign Application Priority Data

Sep. 22, 2006 (FR) .................................. 06 53906

(51) Int. Cl.
*H01L 21/38* (2006.01)
(52) U.S. Cl. ............... 438/548; 136/256; 257/E31.014; 257/E21.466; 438/48; 438/57
(58) Field of Classification Search ................. 136/256; 257/E31.014, E21.466
See application file for complete search history.

(56) References Cited

U.S. PATENT DOCUMENTS

| | | | |
|---|---|---|---|
| 4,927,770 A | 5/1990 | Swanson | |
| 5,053,083 A | 10/1991 | Sinton | |
| 5,899,704 A * | 5/1999 | Schlosser et al. | ............... 438/98 |
| 6,096,968 A * | 8/2000 | Schlosser et al. | ............ 136/256 |
| 6,695,903 B1 * | 2/2004 | Kubelbeck et al. | ..... 106/287.14 |
| 6,825,104 B2 * | 11/2004 | Horzel et al. | ............... 438/547 |
| 6,998,288 B1 | 2/2006 | Smith et al. | |
| 2004/0110393 A1 | 6/2004 | Munzer et al. | |
| 2004/0200520 A1 | 10/2004 | Mulligan et al. | |

OTHER PUBLICATIONS

Jalal Salami, et al., "Diffusion Paste Development for Printable IBC and Bifacial Silicon Solar Cells", Proceedings of the 2006 IEEE 4th World Conference on Photovoltaic Energy Conversion, May 7-12 2006, 3 pages.

Peter Hacke, et al., "A Screen-Printed Interdigitated Back Contact Cell Using a Boron-Source Diffusion Barrier", Solar Energy Materials & Solar Cells 88, 2005, pp. 119-127.

* cited by examiner

*Primary Examiner*—Asok K Sarkar
(74) *Attorney, Agent, or Firm*—Oblon, Spivak, McClelland, Maier & Neustadt, L.L.P.

(57) ABSTRACT

Method for producing doped regions on the rear face of a photovoltaic cell. A doping paste with a first type of conductivity is deposited on a rear face of a semiconductor-based substrate according to a pattern consistent with the desired distribution of regions doped with the first type of conductivity. Then, an oxide layer is deposited at least on the portions of the rear face of the substrate not covered with the doping paste. Finally, an annealing of the substrate diffuses the doping agents in the substrate and forms doped regions under the doping paste.

15 Claims, 3 Drawing Sheets

METHOD FOR PRODUCING DOPED REGIONS IN A SUBSTRATE, AND PHOTOVOLTAIC CELL

TECHNICAL FIELD AND PRIOR ART

This invention relates to the field of photovoltaic or solar cells, and more specifically the field of photovoltaic cells with rear contacts, i.e. comprising metal contacts and a PN junction on a face opposite the face intended to receive light radiation.

The photovoltaic cells can comprise metal contacts on the front face (for example in the form of a grid) and on the rear face. There are also photovoltaic cells, called RCC cells (Rear Contact Cell), or IBC (Interdigitated Back Contact) cells, comprising the PN junction and the metal contacts only on the rear face. Regardless of the structure of the metal contacts (front and rear faces or only rear face), a photovoltaic cell reflects a portion of the light radiation entering the cell through the front face: these are the losses due to reflectivity. By comparison with cells comprising metal contacts on the front face and on the rear face, RCC cells have lower reflectivity losses due to the absence of the grid on the front face.

The principle of RCC cells is to have, in the substrate, at the rear face, P and N doped areas, also called doping structures, forming a PN junction. Documents U.S. Pat. No. 4,927,770 and U.S. Pat. No. 5,053,083 describe RCC cells and methods for producing these cells.

Document U.S. Pat. No. 6,998,288 describes a method for producing doping structures on the rear face and a doped layer on the front face of an RCC cell. The steps of this method are:

- deposition of a first silicon oxide layer doped with a first type of conductivity on a rear face of a substrate (on the side of the future rear face of the RCC cell produced) with a certain type of conductivity, by atmospheric pressure chemical vapour deposition (APCVD),
- APCVD deposition of a first intrinsic silicon oxide layer on the first doped silicon oxide layer,
- screen printing of an etching mask on the first intrinsic silicon oxide layer, defining the distribution of doping structures of the first type of conductivity in the substrate,
- chemical etching of the first doped and intrinsic silicon oxide layers,
- APCVD deposition of a second silicon oxide layer doped with a second type of conductivity, opposite the first type of conductivity, on the first intrinsic silicon oxide layer, and in the patterns etched in the first doped and intrinsic silicon oxide layers,
- APCVD deposition of a second intrinsic silicon oxide layer on the second doped silicon oxide layer,
- texturation of a front face of the substrate by a potassium hydroxide solution,
- annealing of the substrate and deposited layers in a tube diffusion furnace, forming the doping structures of the first and second types of conductivity on the rear face of the substrate, and also forming a doped silicon oxide layer on the front textured face of the substrate.

The disadvantages of such a method are the cost and the number of steps needed to produce doping structures.

The document of P. Hacke et al., "A screen-printed interdigitated back contact cell using a boron-source diffusion barrier", Solar Energy Materials & Solar Cells 88, 2005, pages 119-127, describes another method for producing doping structures at the rear face. A P-type doping paste is first deposited according to a first pattern on a face of a substrate. The substrate is then subjected to a baking operation, causing diffusion of the doping agents of the paste deposited, creating P-doped areas in the substrate according to the first pattern. Simultaneously to this baking, a diffusion of N-type doping agents is caused throughout the substrate. The doping paste acts as a diffusion barrier by preventing the N-type doping agents from doping the areas of the substrate located under this doping paste. Thus, an N-doped substrate comprising P-doped areas is obtained.

Again, the disadvantages of such a method are the cost and an industrial implementation which is difficult to carry out.

DESCRIPTION OF THE INVENTION

Thus there is a need for proposing a method for producing doped regions, or doping structures, in a substrate, that comprises fewer steps than the methods of the prior art, and that is economically beneficial for industrial implementation.

To do this, an embodiment proposes a method for producing doped regions on the rear face of a photovoltaic cell, including at least the steps of:

a) depositing a first doping paste comprising doping agents with a first type of conductivity on a face, called the rear face, of a semiconductor-based substrate according to a pattern consistent with the desired distribution of regions doped with the first type of conductivity in the substrate, b) depositing an oxide layer at least on the portions of the rear face of the substrate not covered with the doping paste, c) annealing the substrate at a temperature diffusing the doping agents in the substrate and forming doped regions, in the substrate, under the doping paste.

By annealing the substrate, we mean in this case and throughout the remainder of the document, an annealing of the semiconductor-based substrate and layers deposited on the substrate.

Thus, a method of this embodiment makes it possible to produce doping structures on the rear face of the substrate while protecting the rest of the substrate from the exodiffusion of the doping agents by the oxide deposit provided before the annealing step. The use of doping pastes makes it possible to reduce the costs of industrial implementation with respect to the plasma depositions performed in the methods of the aforementioned prior art.

A method according to the embodiment can also comprise, between step a) and step b), a step of depositing a second doping paste comprising doping agents with a second type of conductivity, opposite the first type of conductivity, on the rear face of the substrate according to a pattern consistent with the desired distribution of regions doped with a second type of conductivity in the substrate, wherein the regions doped with a second type of conductivity are not superimposed on the regions doped with the first type of conductivity.

Thus, a method according to the embodiment allows for a simultaneous production of doping structures on the rear face of the substrate while ensuring electrical isolation between the doping structures formed by the insertion of the oxide before the annealing step. This method therefore makes it possible to reduce the number of steps for producing doped regions in a substrate, in particular in the production of RCC cells.

A method according to the embodiment can also comprise, between step a) of depositing the first doping paste and the step of depositing the second doping paste, at least the steps of:

a1) depositing an oxide layer on at least the portions of the rear face of the substrate not covered by the first doping paste, a2) annealing the substrate at a temperature diffusing the doping agents in the substrate and forming doped regions, in the substrate, under the doping paste, a3) removing the oxide layer and the doping paste located on the rear face of the substrate.

In this case, the profile of the annealing performed for each doped area is optimised by first producing the regions doped with the first type of conductivity, and then producing the regions doped with the second type of conductivity. For example, the temperature and the duration of the annealing operation will be adjusted according to the doping paste used to produce the doped regions.

A method according to the embodiment can also comprise, between step a1) of depositing the oxide layer and step a2) of annealing the substrate, a step of annealing the substrate at a temperature equal to around 500° C. Thus, two annealing steps are performed successively, at different temperatures. These two steps can, for example, be implemented in an infrared continuous furnace, wherein the furnace comprises a first annealing area at 500° C. and a second annealing area for the diffusion of the doping agents.

At least one annealing of the substrate can be performed in an infrared continuous furnace, i.e. in which the heating is produced by infrared lamps.

A method according to the embodiment can also comprise, for example before step a), a step of depositing an oxide layer on a front face of the substrate, opposite the rear face of the substrate.

A method according to the embodiment can also comprise, before this step of depositing an oxide layer on the front face of the substrate, a step of texturation of the front face of the substrate.

A method according to the embodiment can also comprise, between step b) of depositing an oxide layer and step c) of annealing the substrate at a temperature diffusing doping agents in the substrate, a step of annealing the substrate at a temperature equal to around 500° C. Again, the two successive annealing steps can be implemented in an infrared continuous furnace, as described above.

The annealing of the substrate at a temperature diffusing doping agents in the substrate can be performed at least partially in an oxygen-rich gaseous environment.

Another embodiment also relates to a method for producing a photovoltaic cell, comprising at least the steps of:

producing doped regions in a semiconductor-based substrate according to one of the methods described above, removing the rest of the oxide layer and the doping paste located on a rear face of the substrate, producing metallizations on the rear face of the substrate in the doped regions.

Thus, it is possible to produce photovoltaic cells from a substrate of which the doped regions have been produced according to this method. This method for producing a photovoltaic cell comprises a reduced number of steps owing to the reduced number of steps in the production of doped regions in a substrate. The costs are also reduced owing to the use of doping pastes with respect to the plasma deposits produced in the methods of the prior art. In addition, the photovoltaic cells obtained by this method have a conversion efficiency superior to that of standard photovoltaic cells, i.e. non-RCC cells.

The metallizations can be produced according to any metallization method suitable for the production of photovoltaic cells.

BRIEF DESCRIPTION OF THE DRAWINGS

This invention can be better understood on reading the following description of example embodiments intended purely for indicative and non-limiting purposes, in reference to the appended drawings, in which.

Identical, similar or equivalent parts of the various figures described below have the same numeric references for the sake of consistency between figures.

The various parts shown in the figures are not necessarily shown according to a uniform scale, so as to make the figures easier to read.

The various possibilities (alternatives and embodiments) must be understood as not being mutually exclusive, and can be combined with one another.

DETAILED DESCRIPTION OF SPECIFIC EMBODIMENTS

Reference is first made to FIGS. 1A to 1F, which show the steps of a method for producing a photovoltaic cell 100. A method for producing doped regions in a substrate is also described in relation to these figures.

Figure 1A:
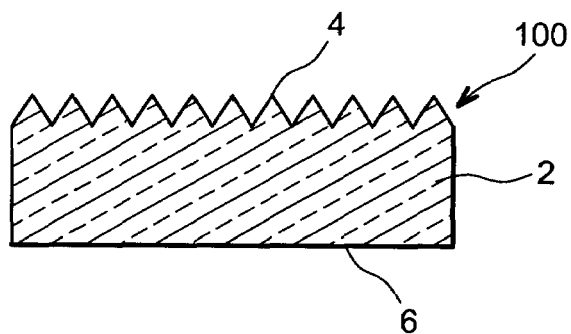
FIGS. 1A to 1E show the steps of a method for producing a photovoltaic cell of the invention, according to a first embodiment, as well as the steps of a method for producing doped regions in a substrate, also according to this invention, according to a first embodiment.

As shown in FIG. 1A, a texturation of a front face 4 of a semiconductor-based substrate 2, for example crystalline silicon, is first performed. This texturation can, for example, be obtained by the use of a potassium hydroxide solution. The substrate 2 comprises a polished or textured rear face 6. The substrate 2 can be a P– or N-type monocrystalline or multicrystalline substrate.

Figure 1B:
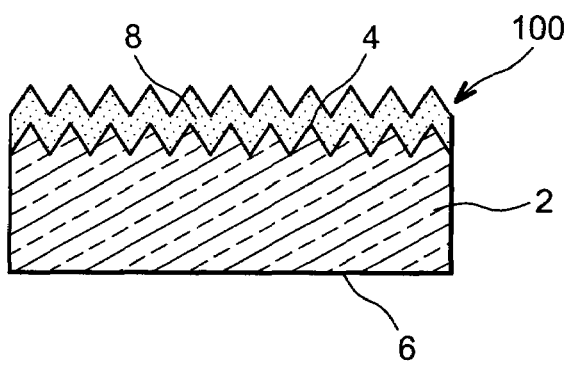

An oxide layer 8, in this case a silicon oxide thin film, is then deposited on the textured front face 4 of the substrate 2 (see FIG. 1B). In this example embodiment, this oxide layer 8 comprises boron or phosphorus-type doping agents; this oxide layer 8 can also be intrinsic. This oxide layer 8 is intended to protect the front face 4 in the subsequence steps of the method. If this oxide layer 8 comprises doping agents, it also serves to dope the front face 4 of the substrate 2, as described below. This oxide layer 8 can, for example, be obtained from a so-called "spin-on" solution deposited by centrifugation, then heated to cause this solution to harden, forming the oxide layer 8. This oxide layer 8 can also be produced conventionally by screen printing, by chemical vapour deposition (CVD) or by spraying (the oxide is projected directly onto the front face 4 of the substrate 2), or by a "curtain" deposition (the front face 4 of the substrate 2 is passed under a continuous oxide flow, forming an oxide "curtain" in order to produce the layer 8).

Figure 1C:
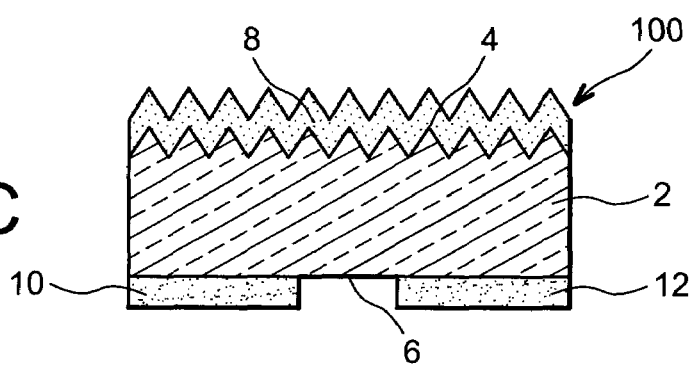
Figure 1D:
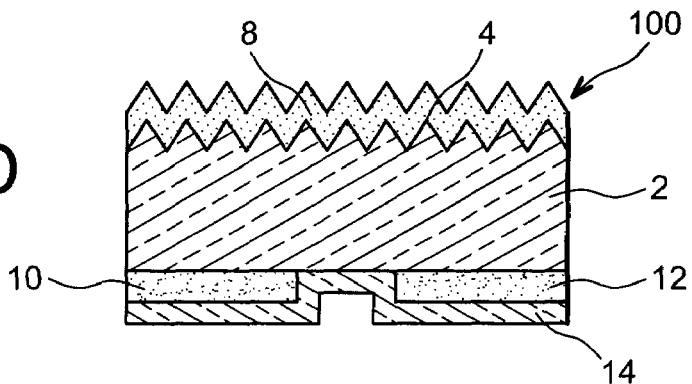

Then, a doping paste 10 with a first type of conductivity, in this case P, comprising boron-type doping agents, is deposited onto the rear face 6 of the substrate 2, as shown in FIG. 1C, by screen printing (step a). This doping paste 10 is deposited according to a first pattern consistent with the desired distribution of the P+ doped regions in substrate 2, i.e. in the locations where the P+ doped regions are desired in the substrate 2. Doping paste 12 with a second type of conductivity, in this case N, comprising phosphorus-type doping agents, is also deposited, for example by screen printing, on the rear face 6 of the substrate 2. This doping paste 12 is deposited in the locations where N+ doped regions are desired in the substrate 2. These N+ and P+ doped regions will form doping structures creating the PN junction of the photovoltaic cell 100. The distribution of doping pastes 10 and 12 can be facilitated by a camera alignment with the presence of patterns on the rear face 6 of the substrate 2, with a precision of +/−20 _m. Examples of doping pastes are described in the article of J. Salami et al.: "Diffusion Paste Development for printable IBC and Bifacial Silicon Solar Cells", Proceedings of the 2006 IEEE 4$^{th}$ World Conference on Photovoltaic Energy Conversion, from 7 to 12 May 2006, Hilton Waikoloa Village, Waikoloa, Hi.

An oxide layer 14, such as a silicon oxide film, is deposited on the portions of the rear face 6 not covered by the doping paste 10 and 12 (step b). This oxide layer 14 is in this case obtained by centrifugation of a "spin-on"-type silicon oxide solution not solubilising the doping pastes 10 and 12. It is possible to use, as oxides, pastes containing a fine powder of SiO2 and/or TiO2 (of which the grain diameter is typically less than 5 micrometers, and even less than 1 micrometer) to obtain a surface trapping the doping agents effectively, for example in the form of a colloidal silica, molten silica, quartz, cristobalite, etc. To do this, the doping pastes 10, 12 are, for example, based on an ethylcellulose resin solubilised in a terpineol-type solvent, and the oxide layer 14 is based on a hydroxypropylcellulose resin solubilised in a propyleneglycol-type solvent. In this case, a first annealing can be performed at a temperature equal to around 500° C., allowing for "debinding" of the doping pastes 10 and 12 and the oxide layer 14, i.e. suppressing the organic bonds in the doping pastes 10 and 12 and in the oxide layer 14. This first annealing can, for example, be performed in an infrared continuous furnace. The oxide layer 14 can also be produced by other techniques, such as the deposition of an oxide film by screen printing, or by a CVD-type deposition.

Figure 1E:
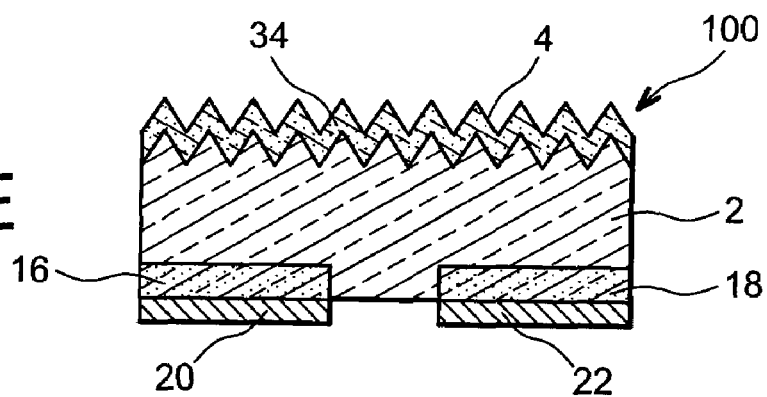

Then, an annealing of the substrate 2 is performed at a temperature diffusing the doping agents of the doping pastes 10 and 12 in the substrate 2 and simultaneously forming P+ doped regions 16 and N+ doped regions 18, shown in FIG. 1E, in the substrate 2, under the patterns formed by the doping pastes 10 and 12. This annealing temperature can, for example, be between around 950° C. and 1000° C., for a period, for example, between around 10 min and 30 min. This annealing can be performed in an infrared continuous furnace allowing for a rapid annealing of the substrate 2 with a line passage suitable for industrial production. Thus, it is possible to successively perform the two annealing steps in the same infrared continuous furnace, with the furnace comprising, for example, a first heating area at around 500° C., then a second heating area at around 950° C. to cause the diffusion of the doping agents in the substrate 2. The oxide layer 8 makes it possible to prevent the exodiffusion of doping agents between the doping pastes 10, 12 and the substrate 2 during the annealing. Thus, the doped regions 16 and 18 obtained are isolated from one another. With the oxide layer 8 in this example being doped, a doped layer 34 is also formed in the substrate 2 on the front face 4, owing to the doping agents present in the oxide layer 8, ensuring the passivation of the front face 4. An addition of oxygen at the end of the annealing can be provided so as to be capable of etching the doping paste residue, then transformed into glass by annealing, with hydrofluoric acid. This addition of oxygen can, for example, be provided in an oxygen-rich environment located in a part of the infrared continuous furnace. The oxide layer 8 is also removed from the front face 4 of the substrate 2.

Metallizations 20 and 22 are then respectively produced on the doped regions 16 and 18, thus contacting the PN junction of the photovoltaic cell 100.

A photovoltaic cell 100 comprising a textured and passivated front face 4, and doped structures, P+ 16 and N+ 18, isolated from one another in the substrate 2, are thus obtained. The doped layer 34 makes it possible to reduce the recombinations on the front face of the cell 100 during the photovoltaic conversion of the solar energy received.

Figure 2A:
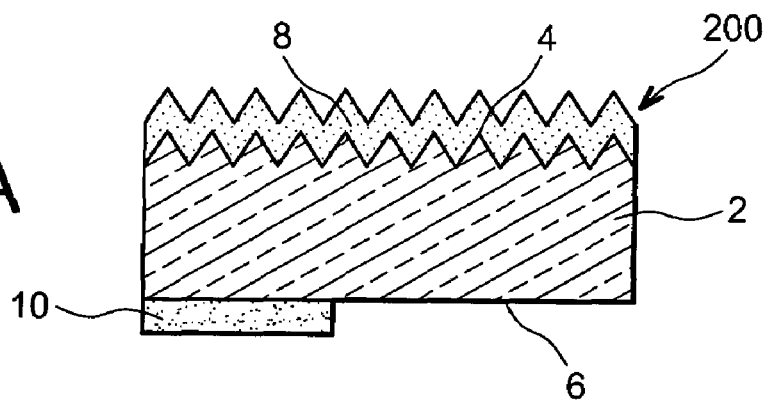
FIGS. 2A to 2E show the steps of a method for producing a photovoltaic cell of the invention, according to a second embodiment, as well as the steps of a method for producing doped regions in a substrate, also according to this invention, according to a second embodiment.
Figure 2B:
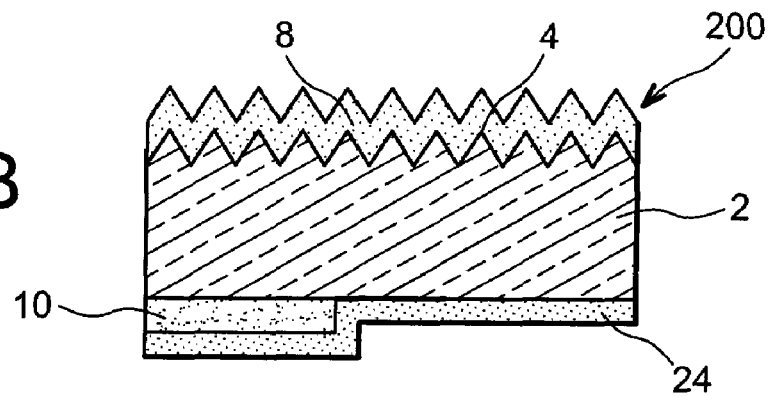
Figure 2C:
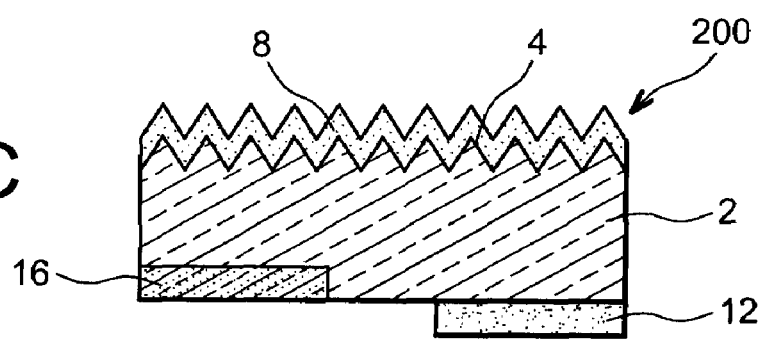
Figure 2D:
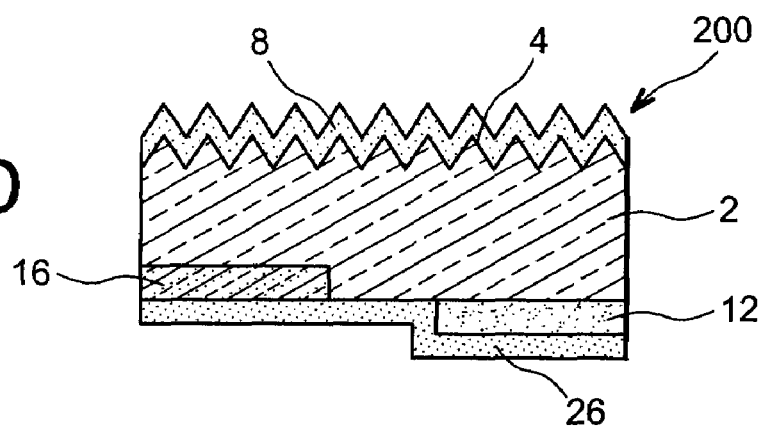
Figure 2E:
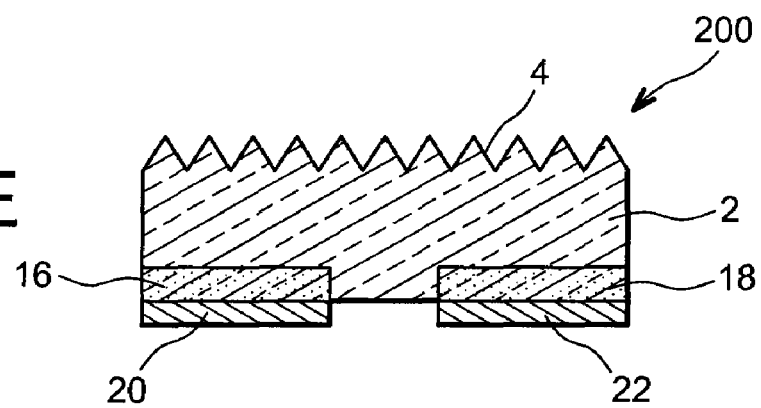

FIGS. 2A and 2E respectively show the steps of a method for producing a photovoltaic cell 200. A method for producing doped regions in a substrate will also be described in association with these figures.

First, a texturation of a front face 4 of a substrate 2, for example similar to substrate 2 described in FIGS. 1A to 1E is provided.

An oxide layer 8, for example a thin film of silicon oxide, is then deposited, for example by screen printing, spraying or "curtain deposition" or centrifugation and heating of a so-called "spin-on" solution on the front face 4 of the substrate 2 (see FIG. 2A). In this example, the oxide layer 8 does not include doping agents and is intended to protect the front face 4 in the subsequent annealing steps of the method. However, as in the preceding example, the oxide layer 8 may contain doping agents.

Then, on the rear face 6 of the substrate 2, as shown in FIG. 2A, doping paste 10 with a first type of conductivity, in this case P, based on boron, is deposited by screen printing, as in FIG. 1C.

Then an oxide layer 24, for example based on silicon oxide, is deposited on the portions of the face 6 not covered by the doping paste.10 and on the doping paste 10, for example by centrifugation and heating (see FIG. 2B). A first annealing of the substrate 2 is performed at a temperature equal to around 500° C. in order to cause debinding of the doping paste 10 and the oxide layer 24. A second annealing of the substrate 2, for example, in an infrared continuous furnace, forms the P+ doped regions 16 in the substrate 2. Again, it is possible to successively perform the two annealing steps in the same infrared continuous furnace, with the furnace comprising, for example, a first heating area at around 500° C., then a second heating area at around 1000° C. to cause the diffusion of the doping agents in the substrate 2. This second annealing can, for example, be performed at a temperature between around 950° C. and 1000° C. for a period between around 10 min and 30 min. The oxide layer 24 and the residue of the doping paste 10 are then chemically removed from the rear face 6 of the substrate 2. At this stage in the process, it is possible to replace the intrinsic oxide layer 8 with a doped oxide layer, which will then dope the front face 4 of the substrate 2 during the subsequent formation of N+ doped regions 18.

Doping paste 12 with a second type of conductivity, in this case N, based on phosphorus, is then deposited (see FIG. 2C) on the rear face 6 of the substrate 2, in the location where the N+ doped regions 18 are desired, as shown in FIG. 2E. The doping paste 12 is deposited on the portions of the face 6 of the substrate 2 that have not previously been doped by the doping paste 10. Another oxide layer 26, for example of a type similar to that oxide layer 24, is deposited by centrifugation on the portions of the face 6 not covered by the doping paste 12 and on the doping paste 12 (FIG. 2D). A third annealing is performed at a temperature equal to around 500° C. in order to "debind" the doping paste 12 and the oxide layer 26. The substrate 2 finally undergoes a fourth annealing, again in an infrared continuous furnace, for example at a temperature between around 850° C. and 900° C., for a period between 10 min and 30 min, forming the N+ doped regions 18 in the substrate 2 (FIG. 2E). If the intrinsic oxide layer 8 has been replaced by a doped oxide layer, then this fourth annealing of the front face 4 also produces a doping of this front face 4.

The oxide layer 26 and the residue of the doping paste 12 are removed from the substrate 2 by techniques similar to those used previously in order to remove the residue of the doping paste 10 and the oxide layer 24.

It will preferably be chosen to first deposit the doping paste 10 or the doping paste 12 requiring the highest annealing temperature for diffusion of the doping agents in the substrate. Thus, the annealing performed in order to diffuse the doping agents of the other doping paste will not modify or will only slightly modify the doping performed previously.

Metallizations 20, 22 can then be produced on these doped regions 16 and 18, for example similarly to the metallization described above for the first embodiment.

The invention claimed is:

1. Method for producing doped regions on the rear face of a photovoltaic cell, comprising at least the steps of:
    a) depositing a first doping paste comprising doping agents with a first type of conductivity on a face, called the rear face, of a semiconductor-based substrate according to a pattern consistent with the desired distribution of regions doped with the first type of conductivity in the substrate,
    b) depositing an oxide layer at least on the portions of the rear face of the substrate not covered with the doping paste,
    c) annealing the substrate at a temperature diffusing the doping agents in the substrate and forming doped regions, in the substrate, under the doping paste.

2. Method according to claim 1, also comprising, between step a) and step b), a step of depositing a second doping paste comprising doping agents with a second type of conductivity, opposite the first type of conductivity, on the rear face of the substrate according to a pattern consistent with the desired distribution of regions doped with a second type of conductivity in the substrate, wherein the regions doped with a second type of conductivity are not superimposed on the regions doped with the first type of conductivity.

3. Method according to claim 2, also comprising between step a) of depositing the first doping paste and the step of depositing the second doping paste, at least the steps of:
    a1) depositing an oxide layer on at least the portions of the rear face of the substrate not covered by the first doping paste,
    a2) annealing the substrate at a temperature diffusing the doping agents in the substrate and forming doped regions, in the substrate, under the doping paste,
    a3) removing the oxide layer and the doping paste located on the rear face of the substrate.

4. Method according to claim 3, also comprising, between step a1) of depositing the oxide layer and step a2) of annealing the substrate, a step of annealing the substrate at a temperature equal to around 500° C.

5. Method according to claim 1, the deposition of the doping paste being performed by screen printing.

6. Method according to claim 1, the deposition of the oxide layer being performed by centrifugation then heating, or by spraying, or by passing under an oxide flux.

7. Method according to claim 1, the doping paste(s) being based on an ethylcellulose resin solubilised in a terpineol-type solvent.

8. Method according to claim 1, oxide used being silicon oxide based on a hydroxypropylcellulose resin solubilised in a propyleneglycol-type solvent.

9. Method according to claim 1, at least one annealing of the substrate being performed in an infrared continuous furnace.

10. Method according to claim 1, also comprising a step of depositing an oxide layer on a front face of the substrate opposite the rear face of the substrate.

11. Method according to claim 10, the oxide layer deposited on the front face of the substrate comprising doping agents.

12. Method according to claim 10, also comprising, before the step depositing an oxide layer on a front face of the substrate, a step of texturation of the front face of the substrate.

13. Method according to claim 1, also comprising, between step b) and step c), a step of annealing the substrate at a temperature equal to around 500° C.

14. Method according to claim 13, the annealing of the substrate at a temperature of around 500° C. being performed in an infrared continuous furnace.

15. Method according to claim 13, the annealing of the substrate at a temperature diffusing doping agents in the substrate being performed at least partially in an oxygen-rich gaseous environment.

* * * * *